United States Patent [19]

Lee et al.

[11] Patent Number: 4,620,115

[45] Date of Patent: Oct. 28, 1986

[54] VOLTAGE-TEMPERATURE COMPENSATED THRESHOLD FOR HYSTERESIS LINE RECEIVER AT TTL SUPPLY VOLTAGE

[75] Inventors: Gil S. Lee; A. Ram Subramaniam, both of San Jose, Calif.

[73] Assignee: Advanced Micro Devices, Inc., Sunnyvale, Calif.

[21] Appl. No.: 648,843

[22] Filed: Sep. 7, 1984

[51] Int. Cl.[4] .................... H03K 17/16; H03K 19/086

[52] U.S. Cl. .................................... 307/443; 307/455; 307/475; 307/491; 307/494; 307/359; 307/296 R

[58] Field of Search ............... 307/443, 455, 475, 491, 307/494, 358, 359, 296 R, 296 A

[56] References Cited

U.S. PATENT DOCUMENTS 4,329,597 5/1982 Yamagiwa .......................... 307/455

4,506,171 3/1985 Evans et al. .................... 307/455 X 4,563,600 1/1986 Kobayashi et al. ................. 307/455

*Primary Examiner*—John S. Heyman

*Assistant Examiner*—D. R. Hudspeth

*Attorney, Agent, or Firm*—Patrick T. King; Davis Chin; J. Vincent Tortolano

[57] ABSTRACT

A line receiver circuit having an input hysteresis characteristic which is compensated for both temperature changes and variations in supply voltage includes a receiver circuit portion, a bandgap circuit portion, a first voltage divider network, a second voltage divider network, and a feedback switching transistor. The receiver circuit portion is responsive to an input logic signal for generating an output signal. The bandgap circuit portion generates a constant reference voltage. The first and second voltage divider networks are operatively connected to the constant reference voltage. The switching transistor is responsive to the output signal for switching between the first voltage divider network generating a high threshold voltage when the input logic signal is in the low level state and the second voltage divider network generating a low threshold voltage when the input logic signal is in the high level state.

17 Claims, 2 Drawing Figures

Vcc Vcc Vcc Vcc
R4 8K
Q3
10
D4
R3 1K
Q6
Z
B
Q4 Q5
R9 5K
Vcc
14
R13 2.53K
D9
A
BAND GAP CIRCUIT
V'
V
R6 1.6K
Q14
R7 5.8K
C
Q16
Q18
12
R16 0.4K
R65 5K
R24 1.6K

VOLTAGE-TEMPERATURE COMPENSATED THRESHOLD FOR HYSTERESIS LINE RECEIVER AT TTL SUPPLY VOLTAGE

BACKGROUND OF THE INVENTION

1. Field of the Invention

The present invention relates generally to interface circuits and more particularly, it relates to a line receiver circuit having an input hysteresis characteristic which is compensated for both temperature changes and variations in TTL compatible supply voltage.

2. Description of the Prior Art

It is generally known that all electronic circuits have difficulties when noise is encountered. While digital circuits typically have a higher tolerance to noise than analog circuity, they are not completely immune from it. Thus, it has come to be extremely important in many applications for logic circuits to be capable of operating reliably in a noisy environment. In an effort to increase the noise immunity of logic circuits, there have been attempted in the prior art of providing hysteresis in the threshold voltage so that a high threshold voltage is generated in a line receiver circuit when the input logic signal is in the low level and a low threshold voltage is generated when the input logic signal is in the high level. This has the effect of increasing the ability of a circuit to withstand short, noise voltage pulses that appear at the input to the logic circuit without causing a change of states as its output.

Such a circuit of the prior art which provides an input hysteresis characteristic has been manufactured and sold by Advanced Micro Devices, Inc., under the part designation of Am 26S12/12A. However, this circuit is compensated for temperature only and does not compensate for variations in the supply voltage.

Another prior art circuit having an input hysteresis characteristic which is compensated both for temperature and supply voltage variations has been manufactured and sold by Texas Instruments, Inc. However, this circuit is designed to be operated with two supply voltages of +12 volts and −12 volts, which is not a TTL compatible supply voltage.

The present invention represents an improvement over these prior art circuits. The hysteresis line receiver of the instant invention provides both a high threshold voltage and a low threshold voltage which can be switched between the two threshold voltages. Further, the threshold voltages are maintained in a stable condition over temperature changes and variations in a TTL compatible supply voltage.

SUMMARY OF THE INVENTION

Accordingly, it is a general object of the present invention to provide an improved hysteresis line receiver circuit for which is compensated both for temperature changes and variations in a TTL compatible supply voltage.

It is an object of the present invention to provide a hysteresis line receiver circuit compensated for both temperature changes and variations in supply voltage which includes a bandgap circuit portion adapted for generating a constant reference voltage to a receiver circuit portion and a feedback switching transistor for switching between a pair of voltage divider networks.

It is another object of the present invention to provide a hysteresis line receiver circuit which includes switching means responsive to an output signal from a receiver circuit portion for switching between a first voltage divider network generating a high threshold voltage when the input logic signal is in the low state and a second voltage divider network generating a low threshold voltage when the input logic signal is in the high state.

It is still another object of the present invention to provide a hysteresis line receiver circuit compensated for both temperature changes and variations in supply voltage which includes a bandgap circuit portion adapted for generating a constant reference voltage, a receiver circuit portion adapted to receive the constant reference voltage and for receiving a logic signal, a first voltage divider network, a second voltage divider network, and a feedback switching circuit responsive to the output signal from the receiver circuit portion for switching between the first and second voltage divider networks.

In accordance with these aims and objectives, the instant invention is concerned with the provision of a line receiver circuit having an input hysteresis characteristic which is compensated for both temperature changes and variations in supply voltage. The line receiver circuit consists of a receiver circuit portion, a bandgap circuit portion, a first voltage divider network, a second voltage divider network, and a feedback switching transistor. The receiver circuit portion includes a first reference transistor and a second reference transistor. The first reference transistor has its base connected to an input circuit terminal and adapted for receiving a logic signal, its collector coupled to a supply voltage potential through a Schottky diode and its emitter coupled to the emitter of the second reference transistor. The second reference transistor has its base connected to a threshold voltage node and its collector connected to the voltage potential via a load resistor. The receiver circuit portion further includes a multi-emitter output transistor having first and second emitters. The output transistor has its base connected to the collector of the second reference transistor, its collector connected to the voltage potential and its first emitter connected to an output circuit terminal. The bandgap circuit portion is provided for generating a constant reference voltage. The first voltage divider network is formed of a first resistor and a second resistor. One end of the first resistor is connected to one end of the second resistor and to the threshold voltage node. The other end of the first resistor is adapted to receive the constant reference voltage, and the other end of the second resistor is connected to a ground potential. The second voltage divider network is formed of the first resistor and a third resistor. One end of the third resistor is connected to the common connection of the first and second resistors. The feedback switching transistor has its base coupled to the second emitter of the output transistor through a diode and resistor, its collector connected to the other end of the third resistor and its emitter connected to the ground potential.

BRIEF DESCRIPTION OF THE DRAWINGS

These and other objects and advantages of the present invention will become more fully apparent from the following detailed description when read in conjunction with the accompanying drawings, wherein.

DESCRIPTION OF THE PREFERRED EMBODIMENT

Figure 1:
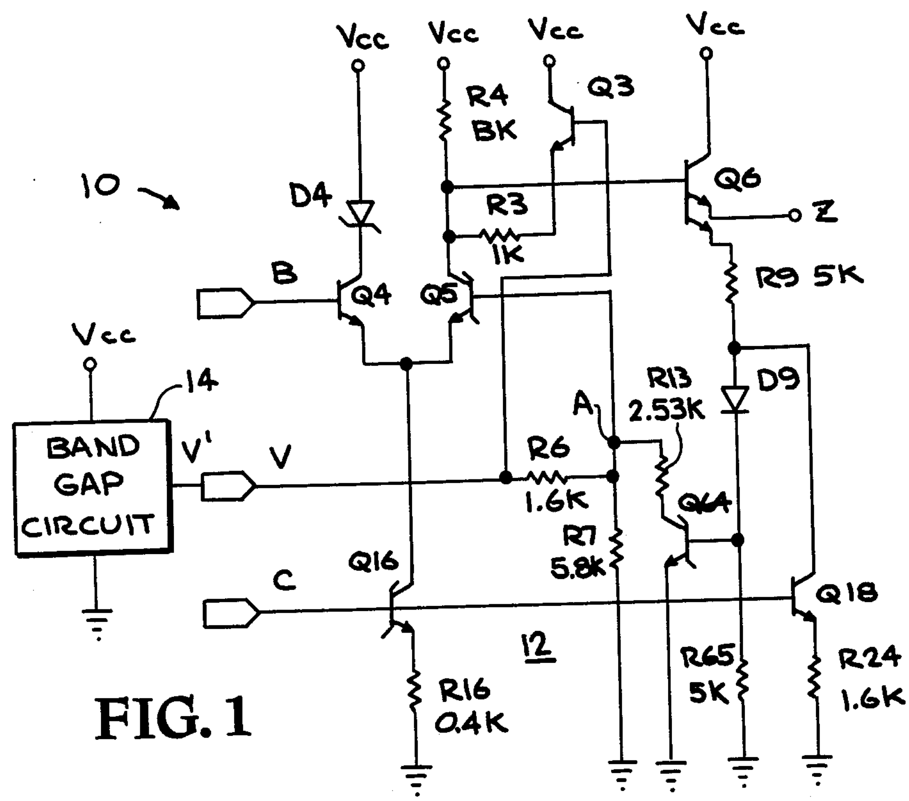
FIG. 1 is a schematic circuit diagram of a hysteresis line receiver circuit embodying the principles of the present invention.

Referring now in detail to FIG. 1 of the drawings, there is shown a line receiver circuit 10 which has an input hysteresis characteristic and which is compensated for both temperature changes and variations in a TTL compatible supply voltage. The line receiver circuit 10 is comprised of a receiver circuit portion 12 and a bandgap circuit portion 14.

The receiver circuit portion 12 includes a single differential transistor circuit formed of a first reference transistor Q4 and a second reference transistor Q5. The base of the transistor Q4 is connected to an input circuit terminal B which receives an input logic signal. The collector of the transistor Q4 is connected to one end of a Schottky diode D4, and the other end of the diode D4 is connected to a TTL compatible supply voltage potential VCC. The supply voltage VCC is thus typically a +5 volts. The emitter of the transistor Q4 is tied to the emitter of the transistor Q5. The base of the transistor Q5 is connected to a threshold voltage node A. The collector of the transistor Q5 is connected to one end of a resistor R4, and the other end of the resistor R4 is tied to the supply potential VCC.

A multi-emitter follower output transistor Q6 has its base connected to the collector of the transistor Q5 and its collector connected to the supply potential VCC. One of the emitters of the transistor Q6 is tied to an output circuit terminal Z to generate an output signal. The other emitter of the transistor Q6 is joined one end of a resistor R9, and the other end of resistor R9 it tied to the anode of a diode D9. The cathode of the diode D9 is connected to one end of a resistor R65, and the other end of the resistor R65 is connected to a ground potential.

A feedback switching transistor Q64 has its base connected also to the cathode of the diode D9. The collector of the transistor Q64 is connected to one end of the resistor R8, and the other end of the resistor R8 is connected to the node A. The emitter of the transistor Q64 is connected to the ground potential. The node A is further connected to the junction of the resistors R6 and R7. The other end of the resistor R6 is tied to a second input circuit terminal V which receives the output signal of the bandgap circuit portion 14 generating a stable reference voltage. The other end of the resistor R7 is tied to the ground potential.

The collector of the transistor Q5 is also connected to one end of a resistor R3, and the other end of the resistor R3 is connected to the emitter of a transistor Q3. The collector of the transistor Q3 is connected to the supply potential VCC. The base of the transistor Q3 is tied to the junction of the resistor R6 and the second input circuit terminal V. A first current source formed of transistor Q16 and resistor R16, is connected to the common emitters of the transistors Q4 and Q5. A second current source formed of transistor Q18 and resistor R24, is connected to the junction of the resistor R9 and the diode D9. The bases of the transistors Q16 and Q18 are tied to a circuit terminal C for receiving a second reference voltage.

Figure 2:
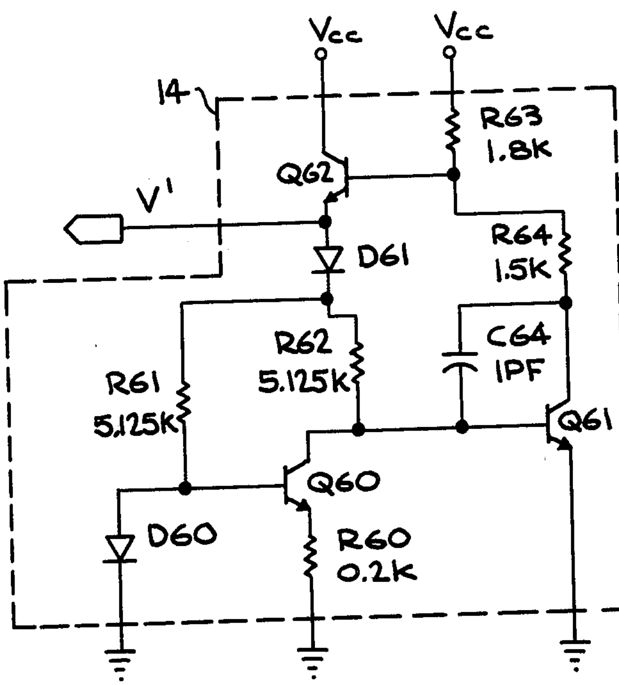
FIG. 2 is a schematic circuit diagram of a bandgap circuit for use in the block 14 of FIG. 1.

The bandgap circuit portion shown as a block 14 in FIG. 1 is illustrated in a detailed schematic in FIG. 2 of the drawings. The bandgap circuit portion 14 generates at its output terminal V' a constant reference voltage which has a high stability over the temperature range of −55° C. to +125° C. and variations in the supply voltage VCC of 5 volts ±10%. Typically, the reference voltage at the output terminal V' is set to be approximately 2.6 volts which is adapted to be fed into the second input terminal V of the receiver circuit portion 12.

As can be seen from FIG. 2, the bandgap circuit portion 14 includes a transistor Q62 which has its base connected to one end of a resistor R63, its collector connected to a supply voltage potential VCC and its emitter connected to the output terminal V'. The supply voltage potential VCC for the bandgap circuit portion is the same one as for the receiver circuit portion. Thus, only one supply voltage is required in the present invention as opposed to the dual power supply needed for the line receiver type SN75152 from Texas Instruments. The other end of the resistor R63 is also tied to the supply voltage potential VCC.

The emitter of the transistor Q62 is further connected to the anode of a diode D61. The cathode of the diode D61 is tied to the common junction of the resistors R61 and R62. The other end of the resistor R61 is joined to the anode of a diode D60 and to the base of a transistor Q60. The cathode of the diode D60 is connected to a ground potential. The other end of the resistor R62 is connected to the collector of the transistor Q60 and to the base of the transistor Q61. The emitter of the transistor Q60 is connected to one end of a resistor R60, and the other end of the resistor R60 is tied to the ground potential.

The base of the transistor Q61 is also connected to one side of a capacitor C64, and the other side of the capacitor C64 is coupled to one end of a resistor R64 and to the collector of the transistor Q61. The other end of the resistor R64 is connected to the other end of the resistor R63 and to the base of the transistor Q62. The emitter of the transistor Q61 is connected to the ground potential. It should be understood by those skilled in the art that the line receiver circuit portion and the bandgap circuit portion may be formed as an integrated circuit on a single semiconductor chip.

In operation, a high threshold voltage $V_{TH}$ or a low threshold voltage $V_{TL}$ is generated at the base of the transistor Q5 or the threshold node A dependent upon whether the input logic signal at the circuit terminal B is in the low or high level state. Assuming that the input logic signal is in the low level state or logic "0", the transistor Q4 will be turned off or non-conductive and the transistor Q5 will be turned on or rendered conductive. This pulls out the current from the resistor R4. Thus, the base potential of the transistor Q6 will be lowered so that the output circuit terminal Z will produce an output signal which will be in a low level state. With the emitter voltage of the transistor Q6 being rendered low, the feedback switching transistor Q64 will also be turned off. This, in turn, causes the output voltage on circuit terminal V' from the bandgap circuit portion to be scaled down through the resistors R6 and R7 defining a first voltage divider network. In this condition, the voltage at the node A defines the high threshold voltage $V_{TH}$.

Assuming now that the input logic signal on the circuit terminal B is in the high level state or logic "1", the transistor Q4 will be turned on or rendered conductive and the transistor Q5 will be turned off. With the transistor Q5 being in the non-conductive state, there is sufficient base current drive to turn on the transistor Q6 so that the output signal at the output circuit terminal Z will be in the high level state. With the emitter of transistor Q6 being in high state, there will be adequate base current drive to turn on the feedback switching transistor Q64. This, in turn, causes the output voltage at the output terminal V' of the bandgap circuit portion to be scaled down through the resistor R6 and R8 defining a second voltage divider network. In this condition, the voltage at the node A defines the low threshold voltage $V_{TL}$.

Therefore, it should be understood that the transistor Q64 forms a switching means for switching between the first voltage divider network generating a high threshold voltage $V_{TH}$ when the input logic signal is in the low level state and the second voltage divider network generating a low threshold voltage when the input logic signal is in the high level state. During the transition from the high threshold voltage $V_{TH}$ to the low threshold voltage $V_{TL}$, the output voltage on the circuit terminal V' of the bandgap circuit portion does not change. Also, this output voltage does not vary significantly over the temperature and supply voltage ranges.

With the component values for the resistors as shown in FIG. 1, the typical values of the high threshold voltage $V_{TH}$ is approximately 2.015 volts and the low threshold voltage, $V_{TL}$ is approximately 1.412 volts, respectively. Further, it has been determined that the maximum deviation for $V_{TH}$ and $V_{TL}$ over the temperature and supply voltage range is about 50 mv. This is compared to the variations of approximately 200 mv in the $V_{TH}$ and $V_{TL}$ for the prior art circuit type Am26S12/12A from Advanced Micro Devices, assignee of the present invention.

From the foregoing detailed description, it can thus be seen that the present invention provides an improved hysteresis line receiver circuit compensated for both temperature changes and variations in supply voltage. The line receiver circuit of the present invention uses a bandgap circuit portion to generate a constant reference voltage and a feedback switching transistor for switching between a first voltage divider network generating a high threshold voltage when the input logic signal is in the low level state and a second voltage divider network generating a low threshold voltage when the input logic signal is in the high level state.

While there has been illustrated and described what is at present considered to be a preferred embodiment of the present invention, it will be understood by those skilled in the art that the various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A line receiver circuit having an input hysteresis characteristic which is compensated for both temperature changes and variations in supply voltage with a single transistor-transistor logic compatible power supply, said receiver circuit comprising:

a receiver circuit portion including a first reference transistor and a second reference transistor, said first reference transistor having its base connected to an input circuit terminal for receiving a logic signal, its collector coupled to a supply voltage potential via a Schottky diode and its emitter coupled to the emitter of said second reference transistor, said second reference transistor having its base connected to a threshold voltage node and its collector connected to the voltage potential via a load resistor;

said receiver circuit portion further including a multi-emitter output transistor having first and second emitters, said output transistor having its base connected to the collector of said second reference transistor, its collector to the voltage potential and its first emitter connected to an output circuit terminal;

a first voltage divider network formed of a first resistor and a second resistor, one end of the first resistor being connected to one end of the second resistor and to the threshold voltage node, the other end of the first resistor being connected to receive a constant reference voltage, the other end of the second resistor being connected to a ground potential;

a second voltage divider network formed of the first resistor and a third resistor, one end of the third resistor being connected to the common connection of the first and second resistors and threshold voltage node; and a feedback switching transistor having its base coupled to the second emitter of said output transistor, its collector connected to the other end of the third resistor and its emitter connected to the ground potential.

2. A line receiver circuit as claimed in claim 1, further comprising a first current source connected to the common emitters of said first and second reference transistors.

3. A line receiver circuit as claimed in claim 2, wherein said first current source is formed of a transistor and a resistor.

4. A line receiver circuit as claimed in claim 3, further comprising a second current source coupled to the second emitter of said output transistor via a resistor.

5. A line receiver circuit as claimed in claim 4, wherein said second current source is formed of a transistor and a resistor.

6. A line receiver circuit as claimed in claim 1, wherein said switching transistor is turned off to generate a high threshold voltage at the threshold voltage node via the first voltage divider network when the input logic signal is in the low level state.

7. A line receiver circuit as claimed in claim 1, wherein said switching transistor is turned on to generate a low level threshold voltage at the threshold voltage node via the second voltage divider network when the input logic signal is in the high level state.

8. A line receiver circuit as claimed in claim 1, wherein said constant reference voltage is provided by a bandgap circuit portion.

9. A line receiver circuit as claimed in claim 1, wherein said line receiver circuit is formed as an integrated circuit on a single semiconductor chip.

10. A line receiver circuit having an input hysteresis characteristic which is compensated for both temperature changes and variations in supply voltage with a single transistor-transistor logic compatible power supply, said receiver circuit comprising:

a receiver circuit portion including a first reference transistor and a second reference transistor, said first reference transistor having its base connected to an input circuit terminal for receiving a logic signal, its collector coupled to a supply voltage potential via a Schottky diode and its emitter coupled to the emitter of said second reference transistor, said second reference transistor having its base connected to a threshold voltage node and its collector connected to the voltage potential via a load resistor;

said receiver circuit portion further including a multi-emitter output transistor having first and second emitters, said output transistor having its base connected to the collector of said second reference transistor, its collector connected to the voltage potential and its first emitter connected to an output circuit terminal;

a bandgap circuit portion for generating a constant reference voltage;

a first voltage divider network formed of a first resistor and a second resistor, one end of the first resistor being connected to one end of the second transistor and to the threshold voltage node, the other end of the first resistor being connected to receive the constant reference voltage, the other end of the second resistor being connected to a ground potential;

a second voltage divider network formed of the first resistor and a third resistor, one end of the third resistor being connected to the common connection of the first and second resistors and threshold voltage node; and a feedback switching transistor having its base coupled to the second emitter of said output transistor via a resistor and diode, its collector connected to the other end of the third resistor and its emitter connected to the ground potential.

11. A line receiver circuit as claimed in claim 10, further comprising a first current source connected to the common emitters of said first and second reference transistors.

12. A line receiver circuit as claimed in claim 11, wherein said first current source is formed of a transistor and a resistor.

13. A line receiver circuit as claimed in claim 12, further comprising a second current source coupled to the second emitter of said output transistor via a resistor.

14. A line receiver circuit as claimed in claim 13, wherein said second current source is formed of a transistor and a resistor.

15. A line receiver circuit as claimed in claim 10, wherein said switching transistor is turned off to generate a high threshold voltage at the threshold voltage node via the first voltage divider network when the input logic signal is in the low level state.

16. A line receiver circuit as claimed in claim 10, wherein said switching transistor is turned on to generate a low level threshold voltage at the threshold voltage node via the second voltage divider network when the input logic signal is in the high level state.

17. A line receiver circuit as claimed in claim 10, wherein said line receiver circuit is formed as an integrated circuit on a single semiconductor chip.

* * * * *